United States Patent
Keite-Telgenbüscher et al.

(10) Patent No.: US 10,626,305 B2
(45) Date of Patent: Apr. 21, 2020

(54) OLED-COMPATIBLE ADHESIVE MASSES HAVING SILANE WATER SCAVENGERS

(71) Applicant: TESA SE, Norderstedt (DE)

(72) Inventors: Klaus Keite-Telgenbüscher, Hamburg (DE); Christian Schuh, Hamburg (DE)

(73) Assignee: TESA SE, Norderstedt (DE)

(*) Notice: Subject to any disclaimer, the term of this patent is extended or adjusted under 35 U.S.C. 154(b) by 0 days.

(21) Appl. No.: 15/519,711

(22) PCT Filed: Oct. 15, 2015

(86) PCT No.: PCT/EP2015/073896
§ 371 (c)(1),
(2) Date: Apr. 17, 2017

(87) PCT Pub. No.: WO2016/066434
PCT Pub. Date: May 6, 2016

(65) Prior Publication Data
US 2017/0247582 A1    Aug. 31, 2017

(30) Foreign Application Priority Data

Oct. 29, 2014  (DE) .................. 10 2014 222 027

(51) Int. Cl.
*H01L 51/52* (2006.01)
*H01L 51/00* (2006.01)
(Continued)

(52) U.S. Cl.
CPC ............. *C09J 11/06* (2013.01); *C08F 287/00* (2013.01); *C08G 59/24* (2013.01); *C08G 59/687* (2013.01);
(Continued)

(58) Field of Classification Search
None
See application file for complete search history.

(56) References Cited

U.S. PATENT DOCUMENTS

| 3,729,313 A | 4/1973 | Smith |
| 3,741,769 A | 6/1973 | Smith |

(Continued)

FOREIGN PATENT DOCUMENTS

| CN | 101144000 A | 3/2008 |
| CN | 101747590 A | 6/2010 |

(Continued)

OTHER PUBLICATIONS

International Search Report dated Jan. 18, 2016, dated Jan. 29, 2016.

(Continued)

*Primary Examiner* — Bo B Jang
(74) *Attorney, Agent, or Firm* — Norris McLaughlin, P.A.

(57) ABSTRACT

A barrier adhesive for the encapsulation of an (opto)electronic arrangement comprising an adhesive base composed of at least one reactive resin having at least one activatable group, at least one polymer, especially an elastomer, optionally at least one tackifying resin, where the adhesive base has a water vapour permeation rate after the activation of the reactive resin of less than 100 g/m²d, preferably of less than 50 g/m²d, especially less than 15 g/m²d, a transparent molecularly dispersed getter material and optionally a solvent, wherein the getter material is at least one silane having at least one alkoxy group and at least one activatable group.

21 Claims, 4 Drawing Sheets

(51) Int. Cl.
*H01L 51/56* (2006.01)
*C09J 11/06* (2006.01)
*C09J 153/00* (2006.01)
*C09J 9/00* (2006.01)
*C08F 287/00* (2006.01)
*C08G 59/24* (2006.01)
*C08G 59/68* (2006.01)
*C09D 163/00* (2006.01)
*C09J 7/10* (2018.01)
*C09J 7/38* (2018.01)
*C08L 91/00* (2006.01)
*C09J 11/08* (2006.01)
*C09J 133/06* (2006.01)
*C09J 163/00* (2006.01)

(52) U.S. Cl.
CPC ............ *C08L 91/00* (2013.01); *C09D 163/00* (2013.01); *C09J 7/10* (2018.01); *C09J 7/38* (2018.01); *C09J 7/387* (2018.01); *C09J 9/00* (2013.01); *C09J 11/08* (2013.01); *C09J 133/066* (2013.01); *C09J 153/00* (2013.01); *C09J 163/00* (2013.01); *H01L 51/004* (2013.01); *H01L 51/0034* (2013.01); *H01L 51/0043* (2013.01); *H01L 51/5246* (2013.01); *H01L 51/56* (2013.01); *C08K 2201/008* (2013.01); *C09J 2201/128* (2013.01); *C09J 2201/606* (2013.01); *C09J 2203/318* (2013.01); *C09J 2203/322* (2013.01); *C09J 2203/326* (2013.01); *C09J 2203/33* (2013.01); *C09J 2205/102* (2013.01); *C09J 2433/00* (2013.01); *C09J 2453/00* (2013.01); *C09J 2463/00* (2013.01); *H01L 51/5259* (2013.01)

(56) References Cited

U.S. PATENT DOCUMENTS

| | | | |
|---|---|---|---|
| 4,058,401 A | 11/1977 | Crivello | |
| 4,138,255 A | 2/1979 | Crivello | |
| 4,231,951 A | 11/1980 | Smith et al. | |
| 4,250,053 A | 2/1981 | Smith | |
| 4,256,828 A | 3/1981 | Smith | |
| 4,394,403 A | 7/1983 | Smith | |
| 5,304,419 A | 4/1994 | Shores | |
| 6,908,722 B2 | 6/2005 | Ebata et al. | |
| 6,936,131 B2 | 8/2005 | McCormick et al. | |
| 8,460,969 B2 | 6/2013 | Krawinkel et al. | |
| 8,828,500 B2 | 9/2014 | Arai et al. | |
| 9,543,549 B2 | 1/2017 | Mai et al. | |
| 2005/0165169 A1 | 7/2005 | Levey et al. | |
| 2008/0063871 A1 | 3/2008 | Jung et al. | |
| 2010/0063221 A1 | 3/2010 | Manabe et al. | |
| 2010/0068514 A1 | 3/2010 | Ellinger et al. | |
| 2010/0137530 A1 | 6/2010 | Arai et al. | |
| 2011/0036623 A1 | 2/2011 | Keite-Telgenbuescher et al. | |
| 2011/0277915 A1 | 11/2011 | Langezaal et al. | |
| 2013/0131244 A1 | 5/2013 | Benford | |
| 2015/0162568 A1 | 6/2015 | Bai et al. | |

FOREIGN PATENT DOCUMENTS

| | | |
|---|---|---|
| CN | 103756579 A | 4/2014 |
| DE | 10 2008 047 964 A1 | 3/2010 |
| DE | 10 2012 211335 A1 | 1/2014 |
| EP | 0 542 716 B1 | 6/1997 |
| EP | 2 078 608 A1 | 7/2009 |
| EP | 2 380 930 A1 | 10/2011 |
| EP | 2 597 697 A1 | 5/2013 |
| JP | 2005-187793 A | 7/2005 |
| JP | 2005-336490 A | 12/2005 |
| JP | 2008-069352 A | 3/2008 |
| JP | 2010-126699 A | 6/2010 |
| JP | 2012-510546 A | 5/2012 |
| JP | 2013-502028 A | 1/2013 |
| TW | 200821352 | 5/2008 |
| TW | 201035152 A1 | 10/2010 |
| WO | 2004/009720 A2 | 1/2004 |
| WO | 2014/001005 A1 | 1/2014 |
| WO | 2015/154947 A1 | 10/2015 |

OTHER PUBLICATIONS

English Translation of International Search Report dated Jan. 18, 2016, dated Jan. 29, 2016.
English Translation of Korean Office Action dated Apr. 15, 2018 for corresponding Korean application No. 10-2017-7013479.
English Translation of Chinese Office Action corresponding to Chinese application No. 2015-80066338 dated Jul. 4, 2018.
English Translation of Japanese Office Action dated Apr. 15, 2018 for corresponding Japanese application No. 2017-523285.
Translation of Office Action dated Jan. 14, 2019, and issued in connection with Taiwanese Patent Application No. 104135080.

Incozol 2 (oxazolidone)  dimethylbutylideneamino-  with TEE
propyltriethoxysilane

OLED-COMPATIBLE ADHESIVE MASSES HAVING SILANE WATER SCAVENGERS

This is a 371 of PCT/EP2015/073896 filed 15 Oct. 2015, which claims foreign priority benefit under 35 U.S.C. 119 of German Patent Application 10 2014 222 027.0 filed Oct. 29, 2014, the entire contents of which are incorporated herein by reference.

The present invention relates to a barrier adhesive for the encapsulation of an (opto)electronic arrangement comprising an adhesive base composed of at least one reactive resin having at least one activatable group, at least one polymer, especially elastomer, optionally at least one tackifying resin, where the adhesive base has a water vapour permeation rate after the activation of less than 100 g/m²d, preferably of less than 50 g/m²d, especially less than 15 g/m²d, a transparent molecularly dispersed getter material and optionally a solvent. The present invention further relates to an adhesive tape comprising this adhesive and to the use of such an adhesive.

BACKGROUND OF THE INVENTION (Opto)electronic arrangements are being used ever more frequently in commercial products. Arrangements of this kind comprise inorganic or organic electronic structures, for example organic, organometallic or polymeric semiconductors or else combinations thereof. These arrangements and products are rigid or flexible according to the desired use, there being an increasing demand for flexible arrangements. Arrangements of this kind are produced, for example, by printing methods such as relief printing, gravure printing, screen printing, flat printing, or else "non-impact printing", for instance thermal transfer printing, inkjet printing or digital printing. In many cases, however, vacuum methods, for example chemical vapour deposition (CVD), physical vapour deposition (PVD), plasma-enhanced chemical or physical deposition (PECVD) methods, sputtering, (plasma) etching or vaporization, are used, in which case the structuring is generally effected by means of masks.

Examples of (opto)electronic applications that have already been commercialized or are of interest in terms of their market potential include electrophoretic or electrochromic assemblies or displays, organic or polymeric light-emitting diodes (OLEDs or PLEDs) in readout and display devices or as lighting, electroluminescent lamps, light-emitting electrochemical cells (LEECs), organic solar cells, preferably dye or polymer solar cells, inorganic solar cells, preferably thin-film solar cells, especially based on silicon, germanium, copper, indium and selenium, perovskite solar cells, organic field-effect transistors, organic switching elements, organic optical amplifiers, organic laser diodes, organic or inorganic sensors or else organic- or inorganic-based RFID transponders.

Further applications of encapsulating adhesive tapes are known in the field of battery technology, especially in the field of flexible microbatteries and thin-film batteries, very particularly those comprising lithium-containing cathodes, anodes or electrolytes.

Accordingly, in this document, an organic (opto)electronic arrangement is understood to mean an electronic arrangement which comprises at least one electronically functional, at least partly organic constituent—for example organometallic compounds—or wherein the electronically functional structure has a thickness of less than 20 μm.

A technical challenge for the achievement of adequate lifetime and functioning of (opto)electronic arrangements in the field of inorganic and/or organic (opto)electronics, but very particularly in the field of organic (opto)electronics, is considered to be protection of the components present therein from permeates. Permeates may be a multitude of low molecular weight organic or inorganic compounds, especially water vapour and oxygen.

A multitude of (opto)electronic arrangements in the field of inorganic and/or organic (opto)electronics, very particularly in the case of use of organic raw materials, are sensitive both to water vapour and to oxygen, the penetration of water or water vapour being classified as a major problem for many arrangements. During the lifetime of the electronic arrangement, therefore, protection by encapsulation is required, since the performance otherwise declines over the period of use. For example, oxidation of the constituents can result, for instance, in a severe reduction in luminance in the case of light-emitting arrangements such as electroluminescent lamps (EL lamps) or organic light-emitting diodes (OLEDs), in contrast in the case of electrophoretic displays (EP displays), or in efficiency within a very short time in the case of solar cells.

In order to achieve very good sealing, specific barrier adhesives are used (also referred to as adhesives having water vapour barrier properties). A good adhesive for the sealing of (opto)electronic components has low permeability to oxygen and especially to water vapour, has sufficient adhesion on the arrangement and can adapt well thereto.

The barrier action is typically characterized by reporting the oxygen transmission rate (OTR) and the water vapour transmission rate (WVTR). The respective rate indicates the area- and time-based flow of oxygen or water vapour through a film under specific conditions of temperature and partial pressure and possibly further measurement conditions such as relative air humidity. The smaller these values, the better the suitability of the respective material for encapsulation. The reported permeation is not based solely on the values of WVTR or OTR but always also includes specification of the minimum path length of the permeation, for example the thickness of the material, or normalization to a particular path length.

The permeability P is a measure of the ability of gases and/or liquids to permeate through a body. A low P value indicates a good barrier action. The permeability P is a specific value for a defined material and a defined permeate under steady-state conditions with a particular permeation path length, partial pressure and temperature. The permeability P is the product of the diffusion term D and solubility term S: $P=D*S$.

The solubility term S predominantly describes the affinity of the barrier adhesive for the permeate. In the case of steam, for example, a small value of S is achieved by hydrophobic materials. The diffusion term D is a measure of the mobility of the permeate in the barrier material and is directly dependent on properties such as molecular mobility or the free volume. It is often the case that relatively low values are achieved for D in highly crosslinked or highly crystalline materials. However, highly crystalline materials are generally not very transparent, and greater crosslinking leads to lower flexibility. The permeability P typically rises with an increase in molecular mobility, for instance when the temperature is increased or the glass transition point is exceeded.

Attempts to increase the barrier action of an adhesive have to take account of both parameters D and S, especially with regard to the effect on the permeability of water vapour and oxygen. In addition to these chemical properties, effects of physical influences on permeability also have to be considered, especially the mean permeation path length and interfacial properties (adaptation characteristics of the adhesive, adhesion). The ideal barrier adhesive has low D values and S values combined with very good adhesion on the substrate.

A low solubility term S alone is usually insufficient to achieve good barrier properties. A particular classic example of this is that of siloxane elastomers. The materials are extremely hydrophobic (small solubility term), but by virtue of the free rotation about the Si—O bond (large diffusion term) have a comparatively small barrier action against water vapour and oxygen. For good barrier action, a good balance is thus needed between the solubility term S and diffusion term D.

There have been descriptions of barrier adhesives based on styrene block copolymers and resins having maximum hydrogenation levels (see DE 10 2008 047 964 A1). Permeation values (WVTR) of commonly used adhesive systems are also reported here (measured at 37.5° C. and 90% relative humidity). Typical acrylate-based pressure-sensitive adhesives are in the range between 100 g/m² d and 1000 g/m² d. Because of the high mobility of the chains, pressure-sensitive silicone adhesives have even higher permeation values for water of more than 1000 g/m² d. If styrene block copolymers are used as elastomer component, WVTR values in the range from 50-100 g/m² d are achieved for unhydrogenated or incompletely hydrogenated systems and values below 50 g/m² d for hydrogenated systems (for example SEBS). Particularly low WVTR values of less than 15 g/m² d are achieved both with pure poly(isobutylene) elastomers or block copolymers of styrene and isobutylene.

One means of improving the barrier action again is to use substances that react with water or oxygen. Oxygen or water vapour that penetrate into the (opto)electronic arrangement are then bound chemically or physically, preferably chemically, by these substances and hence increase the breakthrough time ("lag time"). The substances are referred to in the literature as "getters", "scavengers", "desiccants" or "absorbers". Only the term "getters" is used hereinafter. One way in which the penetrating water is bound is by physical means via adsorption typically on silica, molecular sieves, zeolites or sodium sulphate. Water is bound chemically via alkoxysilanes, oxazolidines, isocyanates, barium oxide, phosphorus pentoxide, alkali metal and alkaline earth metal oxides (for example calcium oxide), metallic calcium or metal hydrides (WO 2004/009720 A2). However, some fillers are unsuitable for transparent bonding, for example of displays, since the transparency of the adhesive is reduced.

Such getters that have been described in adhesives are mainly inorganic fillers, for example calcium chloride or various oxides (cf. U.S. Pat. No. 5,304,419 A, EP 2 380 930 A1 or U.S. Pat. No. 6,936,131 A). Adhesives of this kind are dominant in edge encapsulation, i.e. in cases where only edges have to be bonded. However, adhesives comprising such getters are unsuitable for full-area encapsulation, since, as detailed above, they reduce transparency.

Organic getters have also been described in adhesives. For example in EP 2 597 697 A1, in which polymeric alkoxysilanes are used as getters. Numerous different silanes as getters in adhesives are mentioned in WO 2014/001005 A1. According to this document, the maximum amount of getter to be used is 2% by weight, since the sensitive electronic assembly to be encapsulated would be damaged in the case of use of higher amounts of getter. A problem is that the organic getter materials used are usually very reactive and lead to damage (called "dark spots") on contact with the sensitive organic electronics in the full-area encapsulation. Adhesives comprising such getters are thus suitable only for edge encapsulation, where impairment of transparency is unimportant.

In summary, getter materials are, for example, salts such as cobalt chloride, calcium chloride, calcium bromide, lithium chloride, lithium bromide, magnesium chloride, barium perchlorate, magnesium perchlorate, zinc chloride, zinc bromide, silicas (for example silica gel), aluminium sulphate, calcium sulphate, copper sulphate, barium sulphate, magnesium sulphate, lithium sulphate, sodium sulphate, cobalt sulphate, titanium sulphate, sodium dithionite, sodium carbonate, potassium disulphite, potassium carbonate, magnesium carbonate, titanium dioxide, kieselguhr, zeolites, sheet silicates such as montmorillonite and bentonite, metal oxides such as barium oxide, calcium oxide, iron oxide, magnesium oxide, sodium oxide, potassium oxide, strontium oxide, aluminium oxide (activated alumina), and also carbon nanotubes, activated carbon, phosphorus pentoxide and silanes; readily oxidizable metals, for example iron, calcium, sodium and magnesium; metal hydrides, for example calcium hydride, barium hydride, strontium hydride, sodium hydride and lithium aluminium hydride; hydroxides such as potassium hydroxide and sodium hydroxide, metal complexes, for example aluminium acetylacetonate; and additionally organic absorbers, for example polyolefin copolymers, polyamide copolymers, PET copolyesters, anhydrides of mono- and polycarboxylic acids such as acetic anhydride, propionic anhydride, butyric anhydride or methyltetrahydrophthalic anhydride, isocyanates or further absorbers based on hybrid polymers, which are usually used in combination with catalysts, for example cobalt, further organic absorbers, for instance lightly crosslinked polyacrylic acid, polyvinyl alcohol, ascorbates, glucose, gallic acid or unsaturated fats and oils.

In accordance with their function, the getter materials are preferably used as essentially permeate-free materials, for example in water-free form. This distinguishes getter materials from similar materials which are used as filler. For example, silica is frequently used as filler in the form of fumed silica. If this filler, however, is stored as usual under ambient conditions, it absorbs water even from the environment and is no longer able to function as a getter material to an industrially utilizable degree. It is only silica that has been dried or kept dry that can be utilized as getter material. However, it is also possible to use materials partly complexed with permeates, for example $CaSO_4*½H_2O$ (calcium sulphate hemihydrate) or partly hydrated silicas which exist by definition as compounds of the general formula $(SiO_2)$ $m*nH_2O$.

As described above, silicas are understood to mean compounds of the general formula $(SiO_2)m*nH_2O$. This is silicon dioxide produced by wet-chemical, thermal or pyrogenic methods. More particularly, suitable getter materials among the silicas are silica gels, for example silica gels impregnated with cobalt compounds as moisture indicator (blue gel), and fumed silicas.

In the case of full-area encapsulation, there are opposing requirements of high reactivity of the getter in order to ensure maximum protection from the penetration of water vapour on the one hand and a low reactivity of the getter in order not to damage the sensitive organic electronics on the other hand.

It was therefore an object of the invention to provide an adhesive which has a long breakthrough time (>1100 h (storage at 60° C./90% r.h.) and >220 h (storage at 85° C./85% r.h.)) and which can be used over the full area for encapsulation of assemblies from organic electronics, without damaging the sensitive organic electronics.

SUMMARY OF THE INVENTION

It has been found that, surprisingly, long breakthrough times can be achieved without significantly damaging the organic electronics, and this can be done while maintaining a high transparency, when the getter material used in a barrier adhesive specified at the outset is at least one silane having at least one alkoxy group and at least one activatable group.

It has been found that, surprisingly, the alkoxysilanes, which are less reactive compared to the organic water scavengers known to those skilled in the art, such as oxazolidines, α-silanes or carbodiimides, distinctly reduce the permeation of moisture through the adhesive and can be bonded over the full area of assemblies from organic electronics (for example OLEDs) without damaging them.

DETAILED DESCRIPTION

Very particularly suitable adhesives are those in which the reactive resin and alkoxysilane have at least one group of the same kind, especially at least one identical activatable group. In this case, the reactive resin and alkoxysilane can polymerize and crosslink with one another in a particularly good manner. "The same kind of functional polymerizable groups" is understood to mean those that are chemically very similar to one another, for example cyclic ethers having different ring size, aliphatic epoxides and cycloaliphatic epoxides or acrylates and methacrylates.

Particularly good activities are achieved when the alkoxy group is an ethoxy group. It has been found that, surprisingly, the ethoxysilanes, which are less reactive compared to methoxysilanes, can reduce the permeation of moisture much better, particularly at high temperatures. This is unexpected since methoxysilanes normally have a higher reactivity than the corresponding ethoxysilanes (cf. Wacker product description 6085e/09.13 "GENIOSIL®", page 11 from September 2013 (09.13)).

Suitable activatable groups are cyclic ethers, acrylates or methacrylates. Particularly suitable cyclic ether groups are an epoxy group or an oxetane group, preference being given to the silanes 2-(3,4-epoxycyclohexyl)ethylmethyldimethoxysilane, 2-(3,4-epoxycyclohexyl)ethylmethyldiethoxysilane, gamma-(glycidoxypropyl)trimethoxysilane, gamma-(glycidoxypropyl)triethoxysilane and especially 2-(3,4-epoxycyclohexyl)ethyltrimethoxysilane and/or 2-(3,4-epoxycyclohexyl)ethyltriethoxysilane.

Particularly good properties are possessed by adhesives where the amount of getter material is at least 2% by weight, preferably at least 3% by weight, especially at least 4% by weight and most preferably at least 5% by weight. It is additionally advantageous when the amount of getter material is simultaneously or alternatively not more than 15% by weight. Very particular preference is given to the ranges of 3% to 15% by weight, preferably 4% to 10% by weight and especially 4.5% to 7% by weight. A relatively large amount of getter material increases the breakthrough time and is therefore desirable. On the other hand, the network density decreases when relatively large amounts of getter are incorporated, which counteracts the getter effect because of the elevated permeation, and so there is also an upper limit to the amount of getter material.

The adhesive of the invention is partly crosslinkable since, as well as the at least one reactive resin component, it also contains at least one polymer, especially an elastomer and optionally a tackifying resin. The gel content of the adhesive, i.e. that proportion of the adhesive which cannot be dissolved on dissolution of the adhesive in a suitable solvent, is less than 90% by weight, especially less than 80% by weight, preferably less than 70% by weight, more preferably less than 50% by weight and most preferably less than 30% by weight.

The proportion of the reactive resin in the adhesive, in an advantageous embodiment, is 15% to 80% by weight, especially 20% to 70% by weight and more preferably 25% to 65% by weight. In order to achieve good ease of use and an elastic adhesive after curing, a preferred reactive resin content is 15% to 35% by weight, especially 20% to 30% by weight. For more highly crosslinked adhesive bonds, reactive resin contents of 65% to 80% by weight are preferred. Reactive resin contents giving a particularly good balance in relation to elasticity and crosslinking level are from 35% to 65% by weight.

In a preferred execution, the reactive resin comprises epoxy groups, especially aliphatic and very especially preferably cycloaliphatic epoxy groups. Of very good suitability are reactive resins containing glycidyl and/or epoxycyclohexyl groups as activatable group.

Preferably, the alkoxysilane is a compound of the general formula

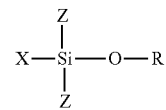

where
R is an alkyl or aryl radical, particular preference being given to ethyl;
X is a radical having a glycidyl or epoxycyclohexyl group, an acrylate or a methacrylate and
Z is an alkyl or aryl group or an alkoxy group, where the Z radicals may be the same or different.

The Z radical may be any alkyl or aryl group or an alkoxy group, particular preference being given to an alkoxy group. Very particularly good results can be achieved when Z is also an ethoxy group. The Z radical may also be different. For instance, the alkoxysilane may also contain, as Z radical, both an ethoxy group and a methoxy group.

In a particularly preferred execution, the X group of the getter is 2-(3,4-epoxycyclohexyl).

According to the invention, it is also possible to use mixtures of two or more getter materials.

In a preferred execution, the adhesive is cured by cationic, thermal or radiation-induced means. It is additionally preferable that the adhesive contains at least one type of initiator, especially a photoinitiator, for the cationic curing of the crosslinkable component.

Preferably, the at least one elastomer is formed from at least one olefinic monomer and/or from at least one polyurethane. More preferably, the elastomer is at least one vinylaromatic block copolymer.

The polymer may be a polymer, or else a mixture of two or more different polymers. In this case, the at least one polymer may especially be an elastomer or a thermoplastic.

Elastomers used may in principle be any elastomers that are customary in the pressure-sensitive adhesives sector, as described, for example, in the "Handbook of Pressure Sensitive Adhesive Technology" by Donatas Satas (Satas & Associates, Warwick 1999).

Preferably in the context of the application, the elastomers used, in a chemical sense, are formed from at least one olefinic monomer or from polyurethane and are, for example, elastomers based on polyurethanes, natural rubbers, synthetic rubbers such as butyl, (iso)butyl, nitrile or butadiene rubbers, styrene block copolymers having an elastomer block formed from unsaturated or partly or fully hydrogenated polydiene blocks (polybutadiene, polyisoprene, poly(iso)butylene, copolymers of these and further elastomer blocks familiar to those skilled in the art), polyolefins, fluoropolymers and/or silicones.

If rubber or synthetic rubber or blends produced therefrom are used as base material for the pressure-sensitive adhesive, the natural rubber may in principle be chosen from all available qualities, for example crepe, RSS, ADS, TSR or CVs, according to the required purity and viscosity level, and the synthetic rubber(s) from the group of the randomly copolymerized styrene-butadiene rubbers (SBR), the butadiene rubbers (BR), the synthetic polyisoprenes (IR), the butyl rubbers (IIR), the halogenated butyl rubbers (XIIR), the acrylate rubbers (ACM), the ethylene-vinyl acetate copolymers (EVA) or the polyurethanes and/or blends thereof.

The at least one polymer used may also be any kind of thermoplastic known to those skilled in the art, as specified, for example, in the textbooks "Chemie und Physik der synthetischen Polymere" [Chemistry and Physics of Synthetic Polymers] by J. M. G. Cowie (Vieweg, Braunschweig) and "Makromolekulare Chemie" [Macromolecular Chemistry] by B. Tieke (VCH Weinheim, 1997). These are, for example, poly(ethylene), poly(propylene), poly(vinyl chloride), poly(styrene), poly(oxymethylenes), poly(ethylene oxide), poly(ethylene terephthalate), poly(carbonates), poly(phenylene oxides), poly(urethanes), poly(ureas), phenoxy resins, acrylonitrile-butadiene-styrene (ABS), poly(amides) (PA), poly(lactate) (PLA), poly(ether ether ketone) (PEEK), poly(sulphone) (PSU), poly(ether sulphone) (PES). Poly(acrylates), poly(methacrylates) and poly(methyl methacrylates) (PMMA) are likewise possible as polymer, but are not preferred in the context of the present invention.

Reactive resins used, also referred to as crosslinkable components, may in principle be any reactive constituents that are known to the person skilled in the art in the field of pressure-sensitive adhesives or reactive adhesives and form macromolecules that crosslink in a molecular weight-increasing reaction, as described, for example, in Gerd Habenicht "Kleben-Grundlagen, Technologien, Anwendungen" [Adhesive Bonding Principles, Technologies, Applications], 6th edition, Springer, 2009. These are, for example, constituents that form epoxides, polyesters, polyethers, polyurethanes or phenol resin, cresol or novolak based polymers, polysulphides or acrylic polymers (acrylic, methacrylic).

The structure and chemical nature of the crosslinkable components are uncritical, provided that they are at least partly miscible with the elastomer phase and the molecular weight-increasing reaction can be conducted under conditions, especially in terms of the temperatures employed, the type of catalysts used and the like, that do not lead to any significant impairment and/or breakdown of the elastomer phase.

The reactive resin preferably consists of a cyclic ether and is suitable for the radiation-chemical and optionally thermal crosslinking with a softening temperature of less than 40° C., preferably of less than 20° C.

The reactive resins based on cyclic ethers are especially epoxides, i.e. compounds which bear at least one oxirane group, or oxetanes. They may be aromatic or especially aliphatic or cycloaliphatic in nature.

Usable reactive resins may be monofunctional, difunctional, trifunctional or tetrafunctional or have higher functionality up to polyfunctional, the functionality relating to the cyclic ether group.

Examples, without wishing to impose a restriction, are 3,4-epoxycyclohexylmethyl-3',4'-epoxycyclohexane carboxylate (EEC) and derivatives, dicyclopentadiene dioxide and derivatives, 3-ethyl-3-oxetanemethanol and derivatives, diglycidyl tetrahydrophthalate and derivatives, diglycidyl hexahydrophthalate and derivatives, ethane 1,2-diglycidyl ether and derivatives, propane 1,3-diglycidyl ether and derivatives, butane-1,4-diol diglycidyl ether and derivatives, higher alkane 1,n-diglycidyl ethers and derivatives, bis[(3,4-epoxycyclohexyl)methyl] adipate and derivatives, vinylcyclohexyl dioxide and derivatives, cyclohexane-1,4-dimethanolbis-(3,4-epoxycyclohexane carboxylate) and derivatives, diglycidyl 4,5-epoxytetrahydrophthalate and derivatives, bis[1-ethyl(3-oxetanyl)methyl) ether and derivatives, pentaerythritol tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxyphenol novolaks, hydrogenated epoxyphenol novolaks, epoxycresol novolaks, hydrogenated epoxycresol novolaks, 2-(7-oxabicyclo;spiro[1,3-dioxane-5,3'-[7]oxabicyclo[4.1.0]-heptane], 1,4-bis((2,3-epoxypropoxy)methyl)cyclohexane.

Particularly suitable for cationic curing are reactive resins based on cyclohexyl epoxide, for example 3,4-epoxycyclohexylmethyl 3',4'-epoxycyclohexanecarboxylate (EEC) and derivatives and bis[(3,4-epoxycyclohexyl)methyl] adipate and derivatives.

Reactive resins may be used in their monomeric or else dimeric forms, trimeric forms, etc. up to and including their oligomeric forms.

Mixtures of reactive resins with one another, or else with other co-reactive compounds such as alcohols (monofunctional or polyfunctional) or vinyl ethers (monofunctional or polyfunctional) are likewise possible.

Among the initiators for cationic UV curing, sulphonium-, iodonium- and metallocene-based systems in particular are usable. For examples of sulphonium-based cations, reference is made to the details given in U.S. Pat. No. 6,908,722 B1 (especially columns 10 to 21).

Examples of anions which serve as counterions for the abovementioned cations include tetrafluoroborate, tetraphenylborate, hexafluorophosphate, perchlorate, tetrafluoroferrate, hexafluoroarsenate, hexafluoroantimonate, pentafluorohydroxyantimonate, hexachloroantimonate, tetrakispentafluorophenylborate, tetrakis(pentafluoromethylphenyl)borate, bi(trifluoromethylsulphonyl)amide and tris(trifluoromethylsulphonyl)methide. Other conceivable anions particularly for iodonium-based initiators are additionally chloride, bromide or iodide, but preference is given to initiators that are essentially free of chlorine and bromine.

More specifically, the usable systems include
sulphonium salts (see, for example, U.S. Pat. Nos. 4,231,951 A, 4,256,828 A, 4,058,401 A, 4,138,255 A and US 2010/063221 A1), such as triphenylsulphonium hexafluoroarsenate, triphenylsulphonium hexafluoroborate, triphenylsulphonium tetrafluoroborate, triphenylsulphonium tetrakis(pentafluorobenzyl)borate, methyldiphenylsulphonium tetrafluoroborate, methyldiphenylsulphonium tetrakis(pentafluorobenzyl)

borate, dimethylphenylsulphonium hexafluorophosphate, triphenylsulphonium hexafluorophosphate, triphenylsulphonium hexafluoroantimonate, diphenylnaphthylsulphonium hexafluoroarsenate, tritolylsulphonium hexafluorophosphate, anisyldiphenylsulphonium hexafluoroantimonate, 4-butoxyphenyldiphenylsulphonium tetrafluoroborate, 4-chlorophenyldiphenylsulphonium hexafluoroantimonate, tris(4-phenoxyphenyl)sulphonium hexafluorophosphate, di(4-ethoxyphenyl)methylsulphonium hexafluoroarsenate, 4-acetylphenyldiphenylsulphonium tetrafluoroborate, 4-acetylphenyldiphenylsulphonium tetrakis(pentafluorobenzyl)borate, tris(4-thiomethoxyphenyl)sulphonium hexafluorophosphate, di(methoxysulphonylphenyl)methylsulphonium hexafluoroantimonate, di(methoxynaphthyl)methylsulphonium tetrafluoroborate, di(methoxynaphthyl)methylsulphonium tetrakis(pentafluorobenzyl)borate, di(carbomethoxyphenyl)methylsulphonium hexafluorophosphate, (4-octyloxyphenyl)diphenylsulphonium tetrakis(3,5-bis(trifluoromethyl)phenyl)borate, tris[4-(4-acetylphenyl)thiophenyl]sulphonium tetrakis(pentafluorophenyl)borate, tris(dodecylphenyl)sulphonium tetrakis(3,5-bis-trifluoromethylphenyl)borate, 4-acetamidophenyldiphenylsulphonium tetrafluoroborate, 4-acetamidophenyldiphenylsulphonium tetrakis(pentafluorobenzyl)borate, dimethylnaphthylsulphonium hexafluorophosphate, trifluoromethyldiphenylsulphonium tetrafluoroborate, trifluoromethyldiphenylsulphonium tetrakis(pentafluorobenzyl)borate, phenylmethylbenzylsulphonium hexafluorophosphate, 5-methylthianthrenium hexafluorophosphate, 10-phenyl-9,9-dimethylthioxanthenium hexafluorophosphate, 10-phenyl-9-oxothioxanthenium tetrafluoroborate, 10-phenyl-9-oxothioxanthenium tetrakis(pentafluorobenzyl)borate, 5-methyl-10-oxothianthrenium tetrafluoroborate, 5-methyl-10-oxothianthrenium tetrakis(pentafluorobenzyl)borate and 5-methyl-10,10-dioxothianthrenium hexafluorophosphate, iodonium salts (see, for example, U.S. Pat. Nos. 3,729,313 A, 3,741,769 A, 4,250,053 A, 4,394,403 A and US 2010/063221 A1), such as diphenyliodonium tetrafluoroborate, di(4-methylphenyl)iodonium tetrafluoroborate, phenyl-4-methylphenyliodonium tetrafluoroborate, di(4-chlorophenyl)iodonium hexafluorophosphate, dinaphthyliodonium tetrafluoroborate, di(4-trifluoromethylphenyl)iodonium tetrafluoroborate, diphenyliodonium hexafluorophosphate, di(4-methylphenyl)iodonium hexafluorophosphate, diphenyliodonium hexafluoroarsenate, di(4-phenoxyphenyl)iodonium tetrafluoroborate, phenyl-2-thienyliodonium hexafluorophosphate, 3,5-dimethylpyrazolyl-4-phenyliodonium hexafluorophosphate, diphenyliodonium hexafluoroantimonate, 2,2'-diphenyliodonium tetrafluoroborate, di(2,4-dichlorophenyl)iodonium hexafluorophosphate, di(4-bromophenyl)iodonium hexafluorophosphate, di(4-methoxyphenyl)iodonium hexafluorophosphate, di(3-carboxyphenyl)iodonium hexafluorophosphate, di(3-methoxycarbonylphenyl)iodonium hexafluorophosphate, di(3-methoxysulphonylphenyl)iodonium hexafluorophosphate, di(4-acetamidophenyl)iodonium hexafluorophosphate, di(2-benzothienyl)iodonium hexafluorophosphate, diaryliodonium tristrifluoromethylsulphonylmethide such as diphenyliodonium hexafluoroantimonate, diaryliodonium tetrakis(pentafluorophenyl)borate such as diphenyliodonium tetrakis(pentafluorophenyl)borate, (4-n-desiloxyphenyl)phenyliodonium hexafluoroantimonate, [4-(2-hydroxy-n-tetradesiloxy)phenyl]phenyliodonium hexafluoroantimonate, [4-(2-hydroxy-n-tetradesiloxy)phenyl]phenyliodonium trifluorosulphonate, [4-(2-hydroxy-n-tetradesiloxy)phenyl]phenyliodonium hexafluorophosphate, [4-(2-hydroxy-n-tetradesiloxy)phenyl]phenyliodonium tetrakis(pentafluorophenyl)borate, bis(4-tert-butylphenyl)iodonium hexafluoroantimonate, bis(4-tert-butylphenyl)iodonium hexafluorophosphate, bis(4-tert-butylphenyl)iodonium trifluorosulphonate, bis(4-tert-butylphenyl)iodonium tetrafluoroborate, bis(dodecylphenyl)iodonium hexafluoroantimonate, bis(dodecylphenyl)iodonium tetrafluoroborate, bis(dodecylphenyl)iodonium hexafluorophosphate, bis(dodecylphenyl)iodonium trifluoromethylsulphonate, di(dodecylphenyl)iodonium hexafluoroantimonate, di(dodecylphenyl)iodonium triflate, diphenyliodonium bisulphate, 4,4'-dichlorodiphenyliodonium bisulphate, 4,4'-dibromodiphenyliodonium bisulphate, 3,3'-dinitrodiphenyliodonium bisulphate, 4,4'-dimethyldiphenyliodonium bisulphate, 4,4'-bis(succinimidodiphenyl)iodonium bisulphate, 3-nitrodiphenyliodonium bisulphate, 4,4'-dimethoxydiphenyliodonium bisulphate, bis(dodecylphenyl)iodonium tetrakis(pentafluorophenyl)borate, (4-octyloxyphenyl)phenyliodonium tetrakis(3,5-bis-trifluoromethylphenyl)borate and (tolylcumyl)iodonium tetrakis(pentafluorophenyl)borate, and ferrocenium salts (see, for example, EP 0 542 716 B1) such as $\eta^5$-(2,4-cyclopentadien-1-yl)-[(1,2,3,4,5,6,9)-(1-methylethyl)benzene]iron.

Examples of commercialized photoinitiators are Cyracure UVI-6990, Cyracure UVI-6992, Cyracure UVI-6974 and Cyracure UVI-6976 from Union Carbide, Optomer SP-55, Optomer SP-150, Optomer SP-151, Optomer SP-170 and Optomer SP-172 from Adeka, San-Aid SI-45L, San-Aid SI-60L, San-Aid SI-80L, San-Aid SI-100L, San-Aid SI-110L, San-Aid SI-150L and San-Aid SI-180L from Sanshin Chemical, SarCat CD-1010, SarCat CD-1011 and SarCat CD-1012 from Sartomer, Degacure K185 from Degussa, Rhodorsil Photoinitiator 2074 from Rhodia, CI-2481, CI-2624, CI-2639, CI-2064, CI-2734, CI-2855, CI-2823 and CI-2758 from Nippon Soda, Omnicat 320, Omnicat 430, Omnicat 432, Omnicat 440, Omnicat 445, Omnicat 550, Omnicat 550 BL and Omnicat 650 from IGM Resins, Daicat II from Daicel, UVAC 1591 from Daicel-Cytec, FFC 509 from 3M, BBI-102, BBI-103, BBI-105, BBI-106, BBI-109, BBI-110, BBI-201, BBI-301, BI-105, DPI-105, DPI-106, DPI-109, DPI-201, DTS-102, DTS-103, DTS-105, NDS-103, NDS-105, NDS-155, NDS-159, NDS-165, TPS-102, TPS-103, TPS-105, TPS-106, TPS-109, TPS-1000, MDS-103, MDS-105, MDS-109, MDS-205, MPI-103, MPI-105, MPI-106, MPI-109, DS-100, DS-101, MBZ-101, MBZ-201, MBZ-301, NAI-100, NAI-101, NAI-105, NAI-106, NAI-109, NAI-1002, NAI-1003, NAI-1004, NB-101, NB-201, NDI-101, NDI-105, NDI-106, NDI-109, PAI-01, PAI-101, PAI-106, PAI-1001, PI-105, PI-106, PI-109, PYR-100, SI-101, SI-105, SI-106 and SI-109 from Midori Kagaku, Kayacure PCI-204, Kayacure PCI-205, Kayacure PCI-615, Kayacure PCI-625, Kayarad 220 and Kayarad 620, PCI-061T, PCI-062T, PCI-020T, PCI-022T from Nippon Kayaku, TS-01 and TS-91 from Sanwa Chemical, Deuteron UV 1240 from Deuteron, Tego Photocompound 1465N from Evonik, UV 9380 C-D1 from GE Bayer Silicones, FX 512 from Cytec, Silicolease UV Cata 211 from Bluestar Silicones and Irgacure 250, Irgacure 261, Irgacure 270, Irgacure PAG 103, Irgacure PAG 121, Irgacure PAG 203, Irgacure PAG 290, Irgacure CGI 725, Irgacure CGI 1380, Irgacure CGI 1907 and Irgacure GSID 26-1 from BASF.

The person skilled in the art is aware of further systems that are likewise usable in accordance with the invention. Photoinitiators are used in uncombined form or as a combination of two or more photoinitiators.

Suitable tackifying resins that are optionally present are tackifying resins as known to those skilled in the art, for example from the Satas.

Particularly advantageously, the pressure-sensitive adhesive contains at least one type of a preferably at least partly hydrogenated tackifying resin, advantageously one compatible with the elastomer component or, if a copolymer formed from hard and soft blocks is used, mainly with the soft block (plasticizer resins).

It is advantageous when corresponding tackifying resin has a softening temperature measured by the Ring & Ball method of greater than 25° C. It is additionally advantageous when, in addition, at least one type of tackifying resin having a softening temperature of less than 20° C. is used. It is possible by this means, if required, to finely adjust the adhesive characteristics on the one hand, but also the adaptation characteristics on the bonding substrate on the other hand.

For comparatively nonpolar elastomers, resins used in the pressure-sensitive adhesive may advantageously be partially or fully hydrogenated resins based on rosin and rosin derivatives, hydrogenated polymers of dicyclopentadiene, partially, selectively or fully hydrogenated hydrocarbon resins based on $C_5$, $C_5/C_9$ or $C_9$ monomer streams, polyterpene resins based on α-pinene and/or β-pinene and/or δ-limonene and/or $\Delta^3$-carene, hydrogenated polymers of preferably pure $C_8$ and $C_9$ aromatics. The aforementioned tackifying resins may be used either alone or in a mixture.

It is possible to use resins that are either solid or liquid at room temperature. In order to assure a high ageing and UV stability, preference is given to hydrogenated resins having a hydrogenation level of at least 90%, preferably of at least 95%.

It is possible to add customary additives to the adhesive, such as ageing stabilizers (antiozonants, antioxidants, light stabilizers, etc.).

Further additives which may typically be utilized are:
plasticizing agents, for example plasticizer oils or low molecular weight liquid polymers, for example low molecular weight polybutenes
primary antioxidants, for example sterically hindered phenols
secondary antioxidants, for example phosphites or thioethers
process stabilizers, for example carbon radical scavengers
light stabilizers, for example UV absorbers or sterically hindered amines
processing auxiliaries and
end block reinforcer resins.

Preference is further given to using an adhesive which is transparent in particular executions in the visible light of the spectrum (wavelength range from about 400 nm to 800 nm). "Transparency" means a mean transmission of the adhesive in the visible range of light of at least 75%, preferably higher than 90%, this consideration relating to uncorrected transmission, i.e. without eliminating interfacial reflection losses by calculation.

Preferably, the adhesive has a haze of less than 5.0%, preferably less than 2.5%.

More preferably, the inventive adhesive is a pressure-sensitive adhesive. This makes it possible for the ease of use to be particularly good, since the adhesive already sticks to the site to be bonded prior to crosslinking.

Pressure-sensitive adhesives refer to adhesives which, even under relatively gentle contact pressure, allow a lasting bond to the substrate and can be detached again from the substrate essentially without residue after use. Pressure-sensitive adhesives are permanently pressure-sensitive at room temperature, and thus have sufficiently low viscosity and high tackiness to the touch, such that they wet the surface of the particular substrate even at low contact pressure. The bonding capacity of corresponding adhesives is based on the adhesive properties, and the redetachability on their cohesive properties. Useful bases for pressure-sensitive adhesives include various materials.

The present invention additionally relates to an adhesive tape coated on one side or on both sides with the inventive adhesive. This adhesive tape may also be a transfer adhesive tape. An adhesive tape enables particularly simple and precise bonding and is therefore particularly suitable.

Finally, the present invention relates to the use of the inventive adhesive or of the inventive adhesive tape as sealing compound, especially for encapsulation of assemblies in organic electronics. As detailed above, it is of eminent importance in organic electronics that the components have to be protected from water (vapour). Because of their very good barrier properties, the inventive adhesives or adhesive tapes are capable of giving corresponding protection. Because of the high transparency and low damage to the electronics to be encapsulated, the inventive adhesive and the inventive adhesive tape, as well as edge encapsulation, are also suitable for full-area encapsulation of organic electronics.

The general expression "adhesive tape" encompasses a carrier material provided with a (pressure-sensitive) adhesive on one or both sides. The carrier material includes any flat structures, for example films or film sections elongated in two dimensions, tapes having extended length and limited width, tape sections, die-cut parts (for example in the form of edges or boundaries of an (opto)electronic arrangement), multilayer arrangements and the like. For various applications, it is possible to combine a wide variety of different carriers, for example films, woven fabrics, nonwoven fabrics and papers, with the adhesives. In addition, the term "adhesive tape" also encompasses what are called "transfer adhesive tapes", i.e. adhesive tape with no carrier. In the case of a transfer adhesive tape, the adhesive is instead applied prior to application between flexible liners provided with a release layer and/or having anti-adhesive properties. For application, it is regularly the case that one liner is first removed, the adhesive is applied and then the second liner is removed. The adhesive can thus be used directly for bonding of two surfaces in (opto)electronic arrangements.

Also possible are adhesive tapes in which there are not two liners but instead a single double-sided separating liner. In that case, the adhesive tape web is covered on its top side with one side of the double-sided separating liner and on its bottom side by the reverse side of the double-sided separating liner, especially of an adjacent winding in a bale or a roll.

The carrier material used for adhesive tape in the present context preferably comprises polymer films, film composites, or films or film composites provided with organic and/or inorganic layers, preference being given to films, especially dimensionally stable polymer films or metal foils. Films/film composites of this kind may consist of any standard plastics used for film production, by way of example but without restriction:

polyethylene, polypropylene—especially oriented propylene produced by mono- or biaxial stretching (OPP), cyclic olefin copolymers (COC), polyvinyl chloride (PVC), polyesters—especially polyethylene terephthalate (PET) and polyethylene naphthalate (PEN), ethylene-vinyl alcohol (EVOH), polyvinylidene chloride (PVDC), polyvinylidene fluoride (PVDF), polyacrylonitrile (PAN), polycarbonate (PC), polyamide (PA), polyether sulphone (PES) or polyimide (PI).

Polyester films have the advantage of ensuring thermal stability and introducing elevated mechanical stability. Most preferably, therefore, a carrier layer in an inventive liner consists of a polyester film, for example of biaxially stretched polyethylene terephthalate.

In a preferred embodiment, the carrier material also includes a barrier function against one or more specific permeate(s), especially against water vapour and oxygen. Such a barrier function may consist of organic or inorganic materials. Carrier materials having a barrier function are described in detail in EP 2 078 608 A1.

More preferably, the carrier material comprises at least one inorganic barrier layer. Inorganic barrier layers of particularly good suitability are metals deposited under reduced pressure (for example by means of vaporization, CVD, PVD, PECVD) or under atmospheric pressure (for example by means of atmospheric plasma, reactive corona discharge or flame pyrolysis), such as aluminium, silver, gold, nickel, or especially metal compounds such as metal oxides, nitrides or hydronitrides, for example oxides or nitrides of silicon, of boron, of aluminium, zirconium, of hafnium or of tellurium, or indium tin oxide (ITO). Likewise suitable are layers of the aforementioned variants that have been doped with further elements.

In the case of double-sidedly (self-)adhesive tapes, the upper and lower layers employed may be inventive adhesives of the same or different kind(s) and/or of the same layer or different layer thickness(es). The carrier on one or both sides may have been pretreated in accordance with the prior art, such that, for example, an improvement in adhesive anchoring is achieved. It is likewise possible for one or both sides to have been modified with a functional layer which can function, for example, as barrier layer. The adhesive layers may optionally be covered with release papers or release films. Alternatively, it is also possible for only one adhesive layer to be covered with a double-sided separating liner.

In one variant, in the double-sided (self-)adhesive tape, an inventive adhesive is provided, as is one further adhesive, for example any having particularly good adhesion to a covering substrate or exhibiting particularly good repositionability.

The thickness of the pressure-sensitive adhesive present either in the form of a transfer adhesive tape or on a flat structure is preferably between 1 µm and 2000 µm, further preferably between 5 µm and 500 µm and more preferably between about 12 µm and 250 µm.

Layer thicknesses between 50 µm and 150 µm are used when improved adhesion on the substrate and/or a dampening effect is to be achieved.

Layer thicknesses between 1 µm and 50 µm reduce the material input. However, there is a reduction in the adhesion on the substrate.

For double-sided adhesive tapes, it is likewise the case for the adhesive(s) that the thickness of the individual pressure-sensitive adhesive layer(s) is preferably between 1 µm and 2000 µm, further preferably between 5 µm and 500 µm and more preferably between about 12 µm and 250 µm. If a further adhesive is used in addition to one inventive adhesive in double-sided adhesive tapes, it may also be advantageous if the thickness thereof is above 150 µm.

Adhesive tapes coated with adhesives on one or both sides are usually wound at the end of the production process to give a roll in the form of an Archimedean spiral. In order to prevent the adhesives from coming into contact with one another in the case of double-sided adhesive tapes, or in order to prevent the adhesive from sticking to the carrier in the case of single-sided adhesive tapes, the adhesive tapes are covered with a covering material (also referred to as separating material) prior to winding, which is wound up together with the adhesive tape. The person skilled in the art knows such covering materials by the name of liner or release liner. As well as the covering of single- or double-sided adhesive tapes, liners are also used to cover pure adhesives (transfer adhesive tape) or adhesive tape sections (for example labels).

A further main claim relates to a method for protecting an organic electronic arrangement disposed on a substrate, wherein a cover is applied to the electronic arrangement in such a way that the electronic arrangement is at least partly covered by the cover, wherein the cover is additionally bonded over at least part of the area on the substrate and/or on the electronic arrangement, wherein the bonding is brought about by means of at least one layer of an adhesive. The adhesive layer especially takes the form of a layer of an adhesive tape.

The method of the invention can advantageously be conducted in such a way that the (pressure-sensitive) adhesive layer, optionally as a constituent of a double-sided adhesive tape comprising further layers, is applied first, and in a subsequent step the cover is applied to the substrate and/or the electronic arrangement. In a further advantageous procedure, the (pressure-sensitive) adhesive layer, optionally as a constituent of a double-sided adhesive tape comprising further layers, and the cover are applied together to the substrate and/or the electronic arrangement.

In the method of the invention, the transfer adhesive tape can thus first be bonded to the substrate or the electronic arrangement or first to the cover. However, it is preferable first to bond the transfer adhesive tape to the cover, since it is thus possible to pre-fabricate one component of the electronic functional unit independently of the electronic arrangement and to attach it by lamination as a whole.

Advantageously, the method of the invention can be conducted in such a way that the cover and/or (pressure-sensitive) adhesive layer, especially as a transfer adhesive tape, fully cover the electronic arrangement, since the light-scattering action then affects the entire area of the arrangement.

The complete lamination of the transfer adhesive tape over the electronic arrangement additionally rules out any effect of harmful permeates possibly enclosed in the gas space of a merely edge-encapsulated arrangement, since there is no gas space.

The method of the invention is preferably conducted in such a way that a region of the substrate around the electronic arrangement is also wholly or partly covered by the cover, in which case the adhesive tape for bonding may cover the full area of the electronic arrangement and preferably likewise covers a region of the substrate around the electronic arrangement, preferably the same region as the cover—or may be applied over part of the area, for instance in the form of a frame around the electronic arrangement—preferably in the region which is also covered by the cover—and optionally additionally in an edge region on the electronic arrangement.

The invention further provides an (opto)electronic arrangement comprising at least one (opto)electronic structure and a layer of an inventive adhesive, wherein the adhesive layer fully covers the (opto)electronic structure.

Further details, features and advantages of the present invention are elucidated in detail hereinafter by preferred working examples.

BRIEF DESCRIPTION OF THE DRAWINGS

FIG. 5 shows a first configuration of an organic electronic arrangement 1 according to the prior art. This arrangement 1 has a substrate 2 with an electronic structure 3 disposed thereon. The substrate 2 itself takes the form of a barrier for permeates and hence forms part of the encapsulation of the electronic structure 3. Above the electronic structure 3, in the present case also spaced apart therefrom, is disposed a further cover 4 that takes the form of a barrier.

Figure 1:
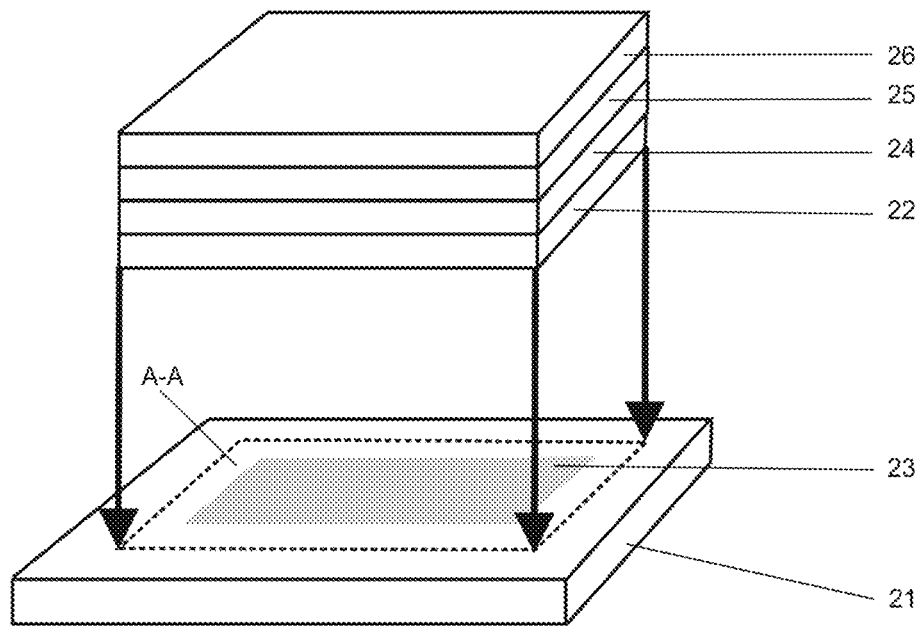
FIG. 1 illustrates a calcium test for determining breakthrough time.

In order to encapsulate the electronic structure 3 at the side as well and simultaneously to bond the cover 4 to the atomic arrangement 1 in addition, an adhesive 5 is provided around the periphery of the electronic structure 3 on the substrate 2. It is unimportant here whether the adhesive has been bonded first to the substrate 2 or first to the cover 4.

The adhesive 5 bonds the cover 4 to the substrate 2. By means of an appropriately thick configuration, the adhesive 5 additionally enables the cover 4 to be spaced apart from the electronic structure 3.

The adhesive 5 is one according to the prior art, i.e. an adhesive having a high permeation barrier, which may additionally also be filled with getter material to a high degree. The transparency of the adhesive is irrelevant in this assembly.

In the present case, a transfer adhesive tape would be provided in the form of a die-cut part which, because of its delicate geometry, is more difficult to handle than a transfer adhesive tape applied essentially over the full area.

Figure 6:
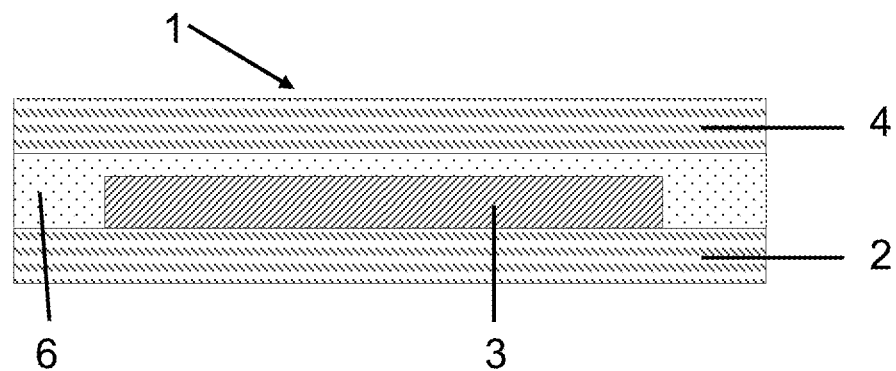
FIG. 6 illustrates a first inventive (opto)electronic arrangement in schematic view.

FIG. 6 shows an inventive configuration of an (opto)electronic arrangement 1. What is shown is again an electronic structure 3 disposed on a substrate 2 and encapsulated by the substrate 2 from beneath. Above and to the side of the electronic structure, the inventive adhesive, for example in the form of a transfer adhesive tape 6, is disposed over the full area. The electronic structure 3 is thus encapsulated fully by the transfer adhesive tape 6 from above. A cover 4 has then been applied to the transfer adhesive tape 6. The transfer adhesive tape 6 is one based on the inventive transfer adhesive tape as described above in general form and detailed hereinafter in working examples. The transfer adhesive tape, in the version shown, consists only of one layer of an inventive adhesive.

In contrast to the above configuration, the cover 4 need not necessarily satisfy the high barrier demands, since the barrier is already provided by the adhesive when the electronic arrangement is fully covered by the transfer adhesive tape. The cover 4 may, for example, merely assume a mechanical protective function, but it may also additionally be provided as a permeation barrier.

Figure 7:
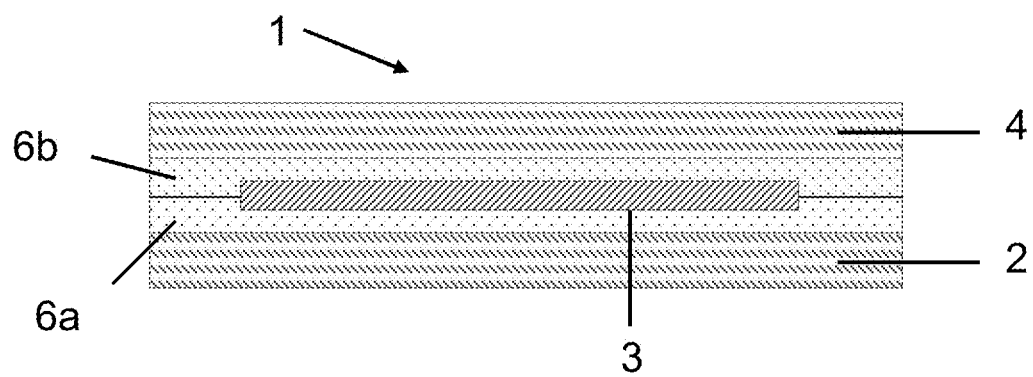
FIG. 7 illustrates a second inventive (opto)electronic arrangement in schematic view.

FIG. 7 shows an alternative configuration of an (opto)electronic arrangement 1. In contrast to the above configurations, two transfer adhesive tapes 6a, b are now provided, which are identical in the present case, but may also be different. The first transfer adhesive tape 6a is disposed over the full area of the substrate 2. The electronic structure 3 is provided upon and is fixed by the transfer adhesive tape 6a. The composite composed of the transfer adhesive tape 6a and electronic structure 3 is then fully covered by the further transfer adhesive tape 6b, such that the electronic structure 3 is encapsulated from all sides by the transfer adhesive tapes 6a, b. The cover 4 is in turn provided above the transfer adhesive tape 6b.

In this configuration, neither the substrate 2 nor the cover 4 need necessarily have barrier properties. They may nevertheless be provided, in order to further restrict the permeation of permeates to the electronic structure 3.

Especially with regard to FIGS. 6 and 7, it is pointed out that these are schematic diagrams. More particularly, it is not clear from the drawings that the transfer adhesive tape here, and preferably in each case, has a homogeneous layer thickness. There is therefore no sharp edge formed at the transition to the electronic structure, as appears to be the case in the diagram; instead, the transition is fluid and it is in fact possible for small unfilled or gas-filled regions to remain. If necessary, however, matching to the substrate may also be effected, especially when the application is conducted under reduced pressure. Moreover, the adhesive is subject to different degrees of local compression, and so flow processes can result in a certain degree of compensation for the height differential at the edge structures. The dimensions shown are not to scale either, but instead serve merely for better illustration. Especially the electronic structure itself is generally relatively flat (often less than 1 µm thick).

Direct contact of the adhesive with the electronic assembly is not obligatory either. It is also possible for further layers to be disposed in between, for example a thin-layer encapsulation of the electronic assembly or barrier films.

The thickness of the transfer adhesive tape may include all customary thicknesses, for instance from 1 µm up to 3000 µm. Preference is given to a thickness between 25 and 100 µm, since bonding force and handling properties are particularly positive in this range. A further preferred range is a thickness of 3 to 25 µm, since the amount of substances permeating through the bondline within this range can be kept to a low level merely by virtue of the small cross-sectional area of the bondline in an encapsulation application.

For production of a transfer adhesive tape of the invention, the carrier of the adhesive tape or the liner is coated or printed on one side with the inventive adhesive from solution or dispersion or in neat form (for example of a melt), or the adhesive tape is produced by (co)extrusion. Alternatively, production is possible by transfer of an inventive adhesive layer by lamination to a carrier material or a liner. The adhesive layer can be crosslinked by means of heat or high-energy beams.

Preferably, this production process takes place in an environment in which the specific permeate is present only in a low concentration or is virtually not present at all. One example is a relative air humidity of less than 30%, preferably of less than 15%.

EXAMPLES

Test Methods

Unless noted otherwise, the measurements are conducted under test conditions of 23±1° C. and 50±5% relative air humidity.

Determination of Breakthrough Time (Lifetime Test)

A measure that was employed for the determination of the lifetime of an electronic assembly was a calcium test. This is shown in FIG. 1. For this purpose, a thin calcium layer 23 of 10×10 mm² in size is deposited onto a glass plate 21 and then stored under a nitrogen atmosphere. The thickness of the calcium layer 23 is about 100 nm. For the encapsulation of the calcium layer 23, an adhesive tape (23×23 mm²) having the adhesive 22 to be tested and a thin glass slide 24 (35 μm, from Schott) as carrier material are used. For stabilization, the thin glass slide was laminated with a 100 μm-thick PET film 26 by means of a 50 μm-thick transfer adhesive tape 25 to give an acrylate pressure-sensitive adhesive of visually high transparency. The adhesive 22 is applied to the glass slide 21 in such a way that the adhesive 22 covers the calcium mirror 23 with an excess margin of 6.5 mm on all sides (A-A). Because of the impervious glass slide 24, only the permeation through the pressure-sensitive adhesive or along the interfaces is determined.

The test is based on the reaction of calcium with water vapour and oxygen, as described, for example, by A. G. Erlat et. al. in "47th Annual Technical Conference Proceedings-Society of Vacuum Coaters", 2004, pages 654 to 659, and by M. E. Gross et al. in "46th Annual Technical Conference Proceedings-Society of Vacuum Coaters", 2003, pages 89 to 92. This involves monitoring the light transmission of the calcium layer, which increases as a result of the conversion to calcium hydroxide and calcium oxide. In the test setup described, this is done from the edge, such that the visible area of the calcium mirror decreases. The time until the light absorption of the calcium mirror has halved is referred to as the lifetime. The method covers both the decrease in the area of the calcium mirror from the edge and via point degradation in the area and the homogeneous reduction in the layer thickness of the calcium mirror resulting from full-area degradation.

Figure 2:
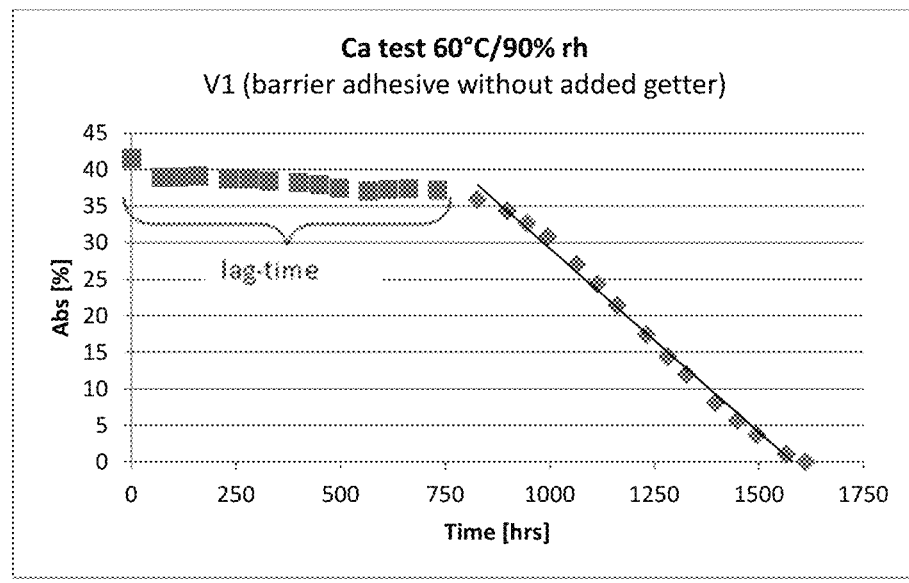
FIG. 2 illustrates the time that moisture takes to cover the distance to the calcium, defined as the breakthrough time.

The measurement conditions chosen were 60° C. and 90% relative air humidity. The specimens were bonded with a layer thickness of the pressure-sensitive adhesive of 50 μm over the full area and with no bubbles. The degradation of the calcium mirror is monitored via transmission measurements. The breakthrough time is defined as that time that moisture takes to cover the distance to the calcium (cf. FIG. 2). Before attainment of this time, there is only a slight change in the transmission of the calcium mirror, then a distinct rise.

Permeability to Water Vapour

The determination of the permeability to water vapour (WVTR) is effected to ASTM F-1249. For this purpose, the pressure-sensitive adhesive is applied with a layer thickness of 50 μm to a highly permeable polysulphone membrane (available from Sartorius) which does not itself make any contribution to the permeation barrier. The water vapour permeability is determined at 37.5° C. and a relative humidity of 90% with an OX-Tran 2/21 measuring instrument.

Molecular Weight

The molecular weight determinations of the number-average molecular weight $M_n$ and the weight-average molecular weight $M_w$ were made by means of gel permeation chromatography (GPC). The eluent used was THF (tetrahydrofuran) with 0.1% by volume of trifluoroacetic acid. The measurement was made at 25° C. The precolumn used was PSS-SDV, 5μ, $10^3$ Å, ID 8.0 mm×50 mm. For separation, the columns used were PSS-SDV, 5μ, $10^3$ and $10^5$ and $10^6$ each with ID 8.0 mm×300 mm. The sample concentration was 4 g/l; the flow rate was 1.0 ml per minute. Measurement was effected against polystyrene standards.

MMAP and DACP

MMAP is the mixed methylcyclohexane/aniline cloud point which is determined using a modified ASTM C 611 method. Methylcyclohexane is used in place of the heptane used in the standard test method. The method uses resin/aniline/methylcyclohexane in a ratio of 1/2/1 (5 g/10 ml/5 ml), and the cloud point is determined by cooling a heated clear mixture of the three components until complete cloudiness has just set in.

The DACP is the diacetone cloud point and is determined by cooling a heated solution of 5 g of resin, 5 g of xylene and 5 g of diacetone alcohol to the point at which the solution turns cloudy.

Ring & Ball Softening Temperature

The tackifying resin softening temperature is determined by the standard methodology, which is known as the Ring & Ball method and is standardized in ASTM E28.

The tackifying resin softening temperature of the resins is determined using a Herzog HRB 754 Ring and Ball tester. Resin specimens are first crushed finely with a mortar and pestle. The resulting powder is introduced into a brass cylinder open at the base (internal diameter in the upper part of the cylinder 20 mm, diameter of the base opening of the cylinder 16 mm, height of the cylinder 6 mm) and melted on a hot stage. The filling volume is chosen such that the resin after melting fills the cylinder fully without excess.

The resulting specimen together with the cylinder is placed into the sample holder of the HRB 754. The equilibration bath is filled with glycerol if the tackifying resin softening temperature is between 50° C. and 150° C. At lower tackifying resin softening temperatures, it is also possible to work with a water bath. The test balls have a diameter of 9.5 mm and weigh 3.5 g. In accordance with the HRB 754 procedure, the ball is arranged above the test specimen in the equilibration bath and placed onto the test specimen. 25 mm beneath the base of the cylinder is a collector plate, and 2 mm above the latter is a light barrier. During the measurement process, the temperature is increased at 5° C./min. In the temperature range of the tackifying resin softening temperature, the ball begins to move through the base opening of the cylinder until it finally comes to rest on the collector plate. In this position, it is detected by the light barrier and the temperature of the equilibration bath at this time is registered. A double determination takes place. The tackifying resin softening temperature is the average from the two individual determinations.

Measurement of Haze and Transmission

The HAZE value describes the proportion of the light transmitted which is scattered forward at wide angles by the sample being irradiated. Thus, the HAZE value quantifies the opaque properties of a layer which disrupt clear transparency.

The transmission and the haze of the adhesive are determined analogously to ASTM D1003-11 (Procedure A (Byk Haze-gard Dual hazemeter), D65 standard illuminant) at room temperature on a 50 μm-thick layer of the adhesive. No correction of interfacial reflection losses is done.

Since correct application on the measuring instrument is important in the case of thin transfer adhesive tapes, in order not to distort the measurement result, an auxiliary carrier was used. The carrier used was a PC film from GE Plastics (Lexan 8010 film, thickness 125 μm).

This carrier met all the criteria (smooth planar surface, very low haze value, high transmission, high homogeneity) for planar attachment of the adhesive tape specimen to the measurement channel.

Adhesive Layers

For production of adhesive layers, various adhesives were applied from a solution to a conventional liner (siliconized polyester film) by means of a laboratory spreading instrument. The adhesive layer thickness after drying was 50±5 μm. Drying was effected in each case firstly at RT for 10 minutes and at 120° C. in a laboratory drying cabinet for 10 minutes. The dried adhesive layers were each laminated on the open side immediately after drying with a second liner (siliconized polyester film with lower release force).

Raw materials used:

The polyacrylate was prepared by the following method:

A 2 l glass reactor of a conventional type for free-radical polymerizations was charged with 40 g of 2-hydroxyethyl acrylate, 240 g of 2-ethylhexyl acrylate, 120 g of C17 acrylate (three branched chains with $C_3$, $C_4$ chain segments, BASF SE), 133 g of 69/95 special boiling point spirit and 133 g of acetone. After nitrogen gas had been passed through the reaction solution while stirring for 45 minutes, the reactor was heated to 58° C. and 0.2 g of Vazo 67 (from DuPont) was added. Subsequently, the external heating bath was heated to 75° C. and the reaction was conducted constantly at this external temperature. After 1 h of reaction time, 50 g of toluene were added. After 2.5 h, dilution was effected with 100 g of acetone. After 4 h of reaction time, another 0.2 g of Vazo 67 was added. After 7 h of polymerization time, dilution was effected with 100 g of 60/95 special boiling point spirit, and after 22 h with 100 g of acetone. After 24 h of reaction time, the polymerization was stopped and the reaction vessel was cooled to room temperature. The molecular weight $M_n$ was 884 000 g/mol.

The copolymer selected was a polystyrene-block-polyisobutylene block copolymer from Kaneka. The proportion of styrene in the overall polymer was 20% by weight. Sibstar 62M was used. The molar mass $M_w$ is 60 000 g/mol. The glass transition temperature of the polystyrene blocks was 100° C. and that of the polyisobutylene blocks –60° C. The tackifying resin used was Escorez 5300 (Ring & Ball 105° C., DACP=71, MMAP=72) from Exxon, a fully hydrogenated hydrocarbon resin. The reactive resin selected was Uvacure 1500 from Dow, a cycloaliphatic diepoxide. These raw materials and optionally the alkoxysiloxane were dissolved in a mixture of toluene (300 g), acetone (150 g) and 60/95 special boiling point spirit (550 g), so as to give a 50% by weight solution.

Subsequently, a photoinitiator was added to the solution. The photoinitiator took the form of a 50% by weight solution in propylene carbonate. The photoinitiator has an absorption maximum in the range of 320 nm to 360 nm.

The exact composition of the individual examples V1 to V7 and of K1 to K3 can be found in Table 1.

| | |
|---|---|
| Sibstar 62M | SiBS (polystyrene-block-polyisobutylene block copolymer) from Kaneka with block polystyrene content 20% by weight. Also contains some diblock copolymers. |
| Uvacure 1500 | cycloaliphatic diepoxide from Cytec ((3,4-epoxycyclohexane) methyl 3,4-epoxycyclohexylcarboxylate) |
| HBE-100 | hydrogenated bisphenol A diglycidyl ether from ECEM |
| Escorez 5300 | a fully hydrogenated hydrocarbon resin from Exxon (Ring and Ball 105° C., DACP = 71, MMAP = 72) |
| Polyacrylate | acrylate copolymer formed from 2-hydroxyethyl acrylate, 2-ethylhexyl acrylate and C-17 acrylate, $M_n$ = 884 000 g/mol |
| 2-(3,4-epoxycyclohexyl)ethyltriethoxysilane | triethoxysilane with cycloaliphatic epoxy group |
| Glycidoxypropyltriethoxysilane | triethoxysilane with glycidyl epoxide group |
| Vinyltrimethoxysilane | |
| 2-(3,4-epoxycyclohexyl)ethyltrimethoxysilane | trimethoxysilane with cycloaliphatic epoxy group |
| Incozol 2 | water scavenger from Incorez (monocyclic alkyl-substituted oxazolidine) |
| Octyltriethoxysilane | triethoxysilane having octyl group (no reactive group) |
| triarylsulphonium hexafluoroantimonate | cationic photoinitiator from Sigma-Aldrich The photoinitiator has an absorption maximum in the range of 320 nm to 360 nm and was in the form of a 50% by weight solution in propylene carbonate. |

TABLE 1

| | Example: | | | | | | | | | | |
|---|---|---|---|---|---|---|---|---|---|---|---|
| | K1 pts. by wt. | K2 pts. by wt. | K3 pts. by wt. | V1 pts. by wt. | V2 pts. by wt. | V3 pts. by wt. | V4 pts. by wt. | V5 pts. by wt. | V6 pts. by wt. | V7 pts. by wt. | V8 pts. by wt. |
| Sibstar 62M | 37.5 | 37.5 | 20 | 37.5 | 37.5 | 37.5 | 37.5 | 22.5 | 37.5 | — | 37.5 |
| Uvacure 1500 | 20 | — | 55 | 25 | — | 20 | 20 | 55 | 20 | — | 20 |
| HBE-100 | — | 20 | — | — | 25 | — | — | — | — | 20 | — |
| Escorez 5300 | 37.5 | 37.5 | 20 | 37.5 | 37.5 | 37.5 | 37.5 | 22.5 | 37.5 | — | 37.5 |
| Polyacrylate | — | — | — | — | — | — | — | — | — | 75 | — |
| 2-(3,4-Epoxycyclohexyl)ethyltriethoxysilane | 5 | — | 5 | — | — | — | — | — | — | — | — |
| Glycidoxypropyltriethoxysilane | — | 5 | — | — | — | — | — | — | — | 5 | — |
| Vinyltrimethoxysilane | — | — | — | — | — | 5 | — | — | — | — | — |
| 2-(3,4-Epoxycyclohexyl)ethyltrimethoxysilane | — | — | — | — | — | — | 5 | — | — | — | — |
| Incozol 2 | | | | | | | | | 5 | | |
| Octyltriethoxysilane | | | | | | | | | | | 5 |
| Triarylsulphonium hexafluoroantimonate | 0.1 | 0.1 | 0.1 | 0.1 | 0.1 | 0.1 | 0.1 | 0.1 | 0.1 | 0.1 | 0.1 |

The specimens were introduced into a glovebox. Some of the specimens were laminated without bubbles with a rubber roller on to a glass substrate which had been subjected to calcium vapour deposition. This was covered with the second PET liner and a ply of a thin glass was laminated on. This was followed by curing through the cover glass by means of UV light (dose: 80 mJ/cm$^2$; lamp type: undoped mercury source). This specimen was used for the lifetime test.

The results of the moisture permeation measurement of the base adhesives (V1/V2/V5) and an acrylate adhesive (V7) without addition of a water scavenger are shown in Table 2.

TABLE 2

| | V1 | V2 | V5 | V7 |
|---|---|---|---|---|
| WVTR/g m$^{-2}$d$^{-1}$ | 7 | 6 | 22 | 673 |

This shows that all the adhesives described here except for V7 have very low WVTR values (less than 100 g/m$^2$d, preferably less than 50 g/m$^2$d, especially less than 15 g/m$^2$d). If these results are compared with the barrier properties achieved, it is found that only the inventive adhesives have a breakthrough time (lag time) with less than 100 g/m$^2$d.

The breakthrough times determined for water in the calcium test are listed in Table 3 below:

TABLE 3

| Designation | K1 | K2 | K3 | V1 | V2 | V3 | V4 | V5 | V6 | V7 | V8 |
|---|---|---|---|---|---|---|---|---|---|---|---|
| Lag time 60° C./90% r.h. | 1300 | 920 | 1500 | 750 | 500 | 800 | 1150 | 1250 | 0 | 0 | 1100 |
| Lag time 85° C./85% r.h. | 240 | 150 | 300 | 155 | 105 | 150 | 200 | 270 | 0 | 0 | 190 |

First of all, comparison of K1 and V8 shows that an activatable group on the silane is advantageous. In addition, comparison of V3 and V4 shows that it is surprisingly advantageous not just to additionally provide any group that can be incorporated by polymerization in the silane, but that a group comparable to that of the reactive resin is advantageous. This is not to be expected by the person skilled in the art, since both groups, both the vinyl group (V3) and the cyclohexyl epoxide group (V4), are additionally incorporated in the cationic polymerization. Thus, the two compositions of the two comparative examples are virtually identical. In contrast to V4, V3 has a silane getter which provides vinyl groups for the cationic polymerization. It is found (Table 3) that the lag time for the silane having the same kind of reactive groups as those in the reactive resin (in this case 2,3-epoxycyclohexyl of Example V4) is significantly higher.

Furthermore, the examples and comparative examples show that, surprisingly, the less reactive triethoxysilane is much more advantageous compared to the more reactive vinyl- and epoxycyclohexyltrimethoxysilane both at 60° C./90% r.h. and particularly at 85° C./85% r.h.

For non-pressure-sensitive liquid adhesives (K3) too, a distinct improvement in breakthrough time can be achieved with the corresponding epoxycyclohexyl getter (comparison of K3/V5).

Compatibility of the Adhesives with OLEDs and Cathode Material (Calcium)

Known transparent getters were incorporated were incorporated into an adhesive in a proportion of 5% by weight.

Figure 3:
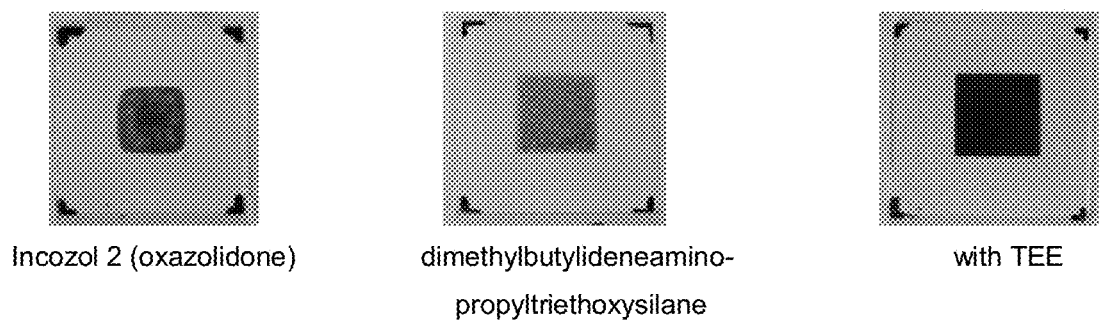
FIG. 3 illustrates the effect of water scavengers on the calcium surface.

The reactivity of these water scavengers is so great that the calcium surface was attacked even in the calcium test. If TEE is used, the calcium remains unaffected. This is recorded in the photographs in FIG. 3.

Figure 4:
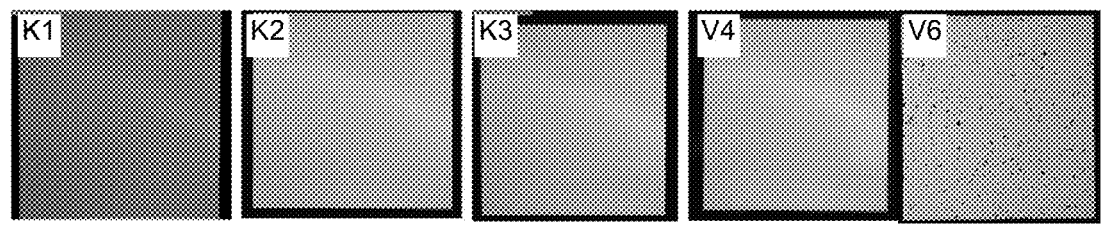
FIG. 4 illustrates the effect of a standard organic water scavenger (Incozol, V6)
Figure 5:
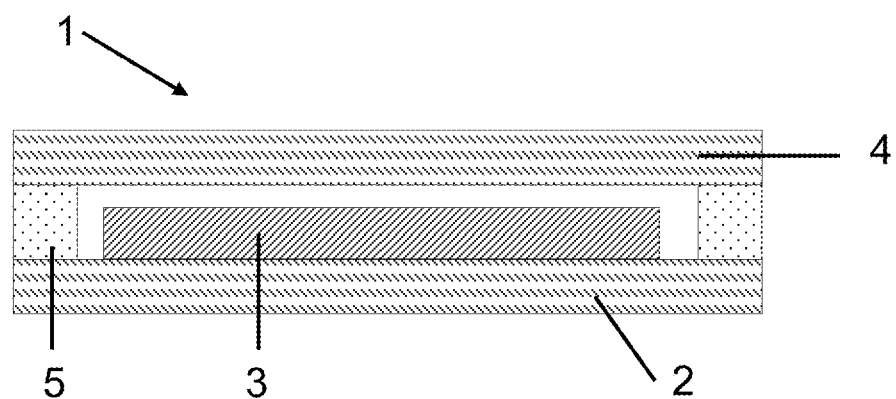
FIG. 5 illustrates an (opto)electronic arrangement according to the prior art in schematic view.

OLED compatibility was demonstrated for the alkoxysilanes that can be incorporated by polymerization, by bonding such adhesives on unencapsulated polymeric OLEDs and storing them at 60° C./90% r.h. for 150 h. As a counter-example, a standard organic water scavenger (Incozol, V6) showed clear damage (dark spots). The results are reproduced in FIG. 4.

Table 4 summarizes the observations once again.

TABLE 4

| Bonding to | K1 | K2 | K3 | V4 | V6 | V1 + 5% DBAPTS* |
|---|---|---|---|---|---|---|
| Calcium | no damage | no damage | no damage | no damage | severe damage | severe damage |
| OLED cathode (barium-aluminium) | no damage | no damage | no damage | no damage | many dark spots | many dark spots |

*DBAPTS: dimethylbutylideneaminopropyltriethoxysilane

The invention claimed is:

1. Barrier adhesive comprising an adhesive base comprising:
   an at least one reactive resin comprising an at least one first activatable group; and
   an at least one polymer,
   wherein:
   the adhesive base has a water vapor permeation rate of less than 100 g/m²d after activation of the at least one reactive resin;
   the adhesive base comprises a transparent molecularly-dispersed getter material;
   the transparent molecularly-dispersed getter material comprises an at least one silane comprising an at least one ethoxy group and an at least one second activatable group;
   the barrier adhesive is a pressure-sensitive adhesive; and
   the at least one polymer comprises an at least one vinylaromatic block copolymer.

2. Barrier adhesive according to claim 1, wherein the at least one reactive resin and the at least one silane have the same kind of groups.

3. Barrier adhesive according to claim 2, wherein the at least one second activatable group is selected from the group consisting of a cyclic ether group, an acrylate, and a methacrylate.

4. Barrier adhesive according to claim 2, wherein the at least one second activatable group comprises a glycidyl group or an epoxycyclohexyl group.

5. Barrier adhesive according to claim 1, wherein an amount of the transparent molecularly-dispersed getter material is at least 2% by weight of the barrier adhesive.

6. Barrier adhesive according to claim 1, wherein an amount of the transparent molecularly-dispersed getter material is not more than 15% by weight of the barrier adhesive.

7. Barrier adhesive according to claim 1, wherein an amount of the transparent molecularly-dispersed getter material is 3% to 15% by weight of the barrier adhesive.

8. Barrier adhesive according to claim 1, wherein the at least one silane is a compound of the formula

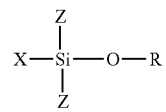

where:
R is an alkyl or aryl radical;
X is a radical comprising a glycidyl group, an epoxycyclohexyl group, an acrylate, or a methacrylate;
$Z_1$ is an ethoxy group; and
$Z_2$ is an ethoxy group,
and where the ethoxy group of $Z_1$ and the ethoxy group of $Z_2$ are the same ethoxy group or different ethoxy groups.

9. Barrier adhesive according to claim 1, wherein the barrier adhesive is cured cationically.

10. Barrier adhesive according to claim 1, further comprising a photoinitiator.

11. Adhesive tape comprising the barrier adhesive according to claim 1.

12. Method comprising encapsulating an assembly with the adhesive tape of claim 11.

13. Method comprising encapsulating an assembly with the barrier adhesive of claim 1.

14. Method comprising applying a cover to an organic electronic arrangement disposed on a substrate such that the organic electronic arrangement is at least partly covered by the cover, wherein:
   the cover is additionally bonded over at least part of an area on the substrate and/or on the organic electronic arrangement; and
   the additional bonding is brought about by an at least one layer of the barrier adhesive of claim 1.

15. Method according to claim 14, wherein the barrier adhesive is in the form of a layer of an adhesive tape.

16. Method according to claim 14, further comprising:
   applying the at least one layer of the barrier adhesive to the substrate and/or the organic electronic arrangement; and
   subsequently applying the cover to the substrate and/or the organic electronic arrangement.

17. Method according to claim 14, further comprising applying the at least one layer of the barrier adhesive and the cover to the substrate and/or the organic electronic arrangement.

18. Method according to claim 14, wherein the cover fully covers the organic electronic arrangement.

19. Method according to claim 14, wherein a region of the substrate around the organic electronic arrangement is wholly or partly covered by the cover.

20. Barrier adhesive according to claim 1, further comprising an at least one tackifying resin.

21. Barrier adhesive according to claim 1, wherein the adhesive base further comprises a solvent.

* * * * *